April 8, 1969 K. A. SIMONS 3,437,948

GROUNDED COLLECTOR AMPLIFIER CIRCUIT

Filed Dec. 14, 1966 Sheet 1 of 2

INVENTOR.
KENETH A. SIMONS

BY

Hopgood & Calimafde

ATTORNEYS.

INVENTOR.
KENETH A. SIMONS
BY
Hopgood & Calimafde
ATTORNEYS

United States Patent Office 3,437,948
Patented Apr. 8, 1969

3,437,948

GROUNDED COLLECTOR AMPLIFIER CIRCUIT

Keneth A. Simons, Bryn Athyn, Pa., assignor to Jerrold Electronics Corporation

Filed Dec. 14, 1966, Ser. No. 601,761
Int. Cl. H03f *1/08, 1/34*
U.S. Cl. 330—28 1 Claim

ABSTRACT OF THE DISCLOSURE

A radio frequency amplifier includes a transistor arranged in common emitter configuration with the collector grounded. A balun couples the input source to the base-emitter of the transistor, and a voltage feedback means is coupled between a tap on an output transformer and the transistor base. Current feedback is simultaneously provided by a resistor in series with the emitter.

This invention relates to low distortion amplifiers, and in particular, to a novel broadband amplifier circuit for use at VHF and UHF television frequencies (hereinafter referred to as VHF).

VHF amplifiers, for example, those used in Community Antenna Television (CATV) systems, are best exemplified by the circuit shown in FIG. 1. This transistor amplifier employs dual feedback, with series or current feedback being provided by an emitter resistor $R_e$ and shunt or voltage feedback being provided by resistor $R_f$ connected between the output and base of transistor $Q_1$. This arrangement combines matched output and input impedances (which are obtained by the proper relative adjustment of the two feedback resistors alluded to above) with a flat frequency response and relatively low distortion for a given output power. These latter features are of prime importance in CATV amplifiers where the band under consideration is relatively broad.

Circuits such as shown in FIG. 1, however, are not without disadvantages. The operation of such a circuit requires that the capacity to ground in the collector circuit be minimized. Since the best available transistors such as RCA 2N3866 have the collector connected to the header, or metal envelope, the transistor must be sufficiently removed from surrounding surfaces and structures. As a result, head dissipation is by radiation and convection. This arrangement is so inefficient that the transistor case typically runs about 100° C. above ambient. It will be appreciated by those skilled in the art that the characteristics of semiconductor devices of the type used are disadvantageously affected by such temperature conditions.

Accordingly, it is the object of this invention to provide a low distortion wide-band VHF amplifier which enjoys the attributes presently afforded by amplifiers such as shown in FIG. 1 without the adverse temperature effects.

It is a further object of this invention to satisfy the foregoing object without resort to extensive circuit modifications.

Briefly, the inventive concept is predicated upon direct grounding of the transistor collector electrode, allowing maximum heat dissipation from the case in conjunction with the utilization of what is ideally a floating input.

The above mentioned and other features and objects of this invention and the manner of attaining them will become more apparent and the invention itself will best be understood by reference to the following description of an embodiment of the invention taken in conjunction with the accompanying drawings wherein.

Figures 1, 2, 3, 4:
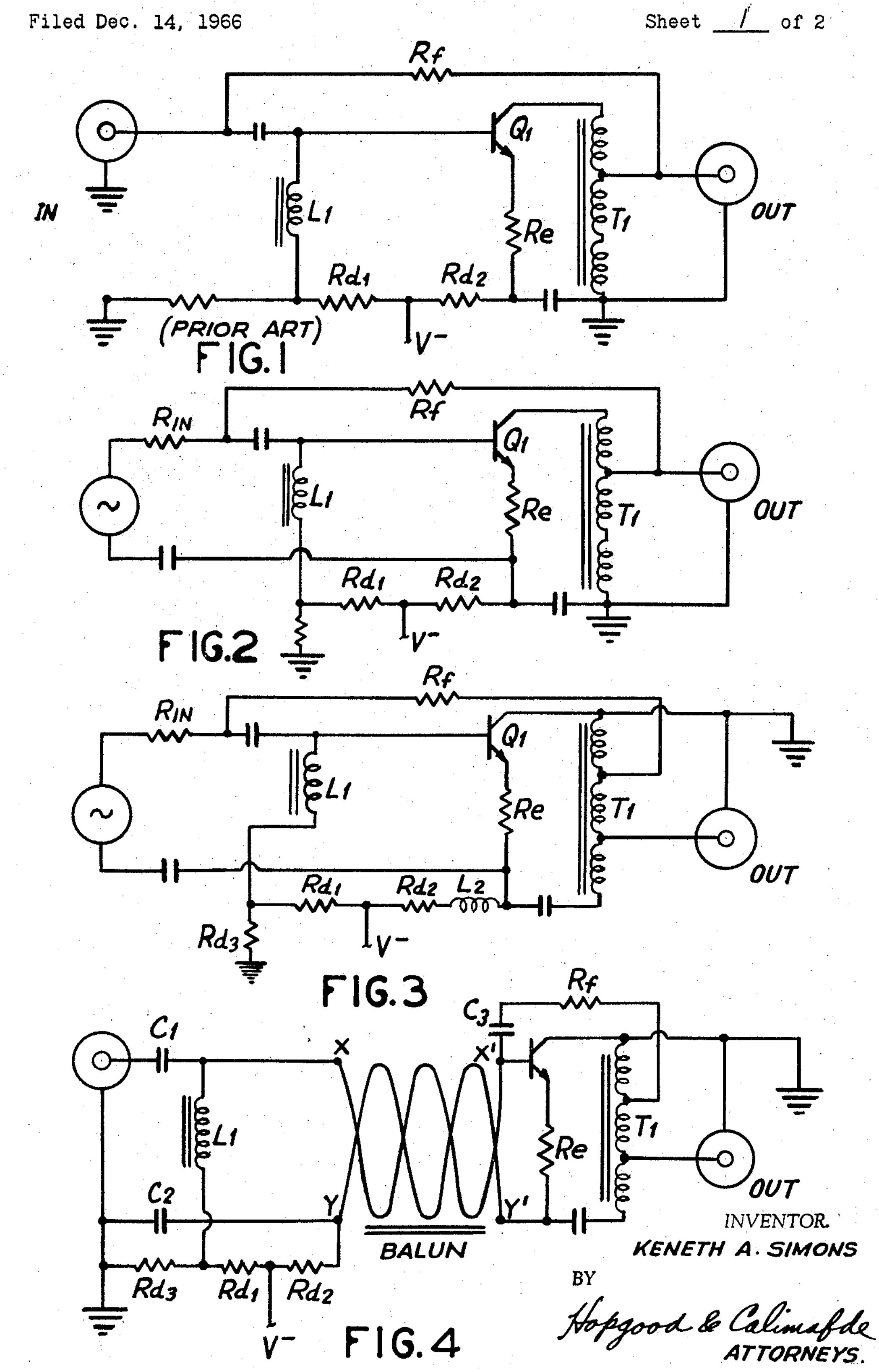
FIG. 1 is a schematic illustration of a VHF amplifier currently in use.
FIG. 2 is a schematic representation of the circuit of FIG. 1 with an idealized floating source.
FIG. 3 illustrates the circuit of FIG. 2 modified to take advantage of the floating source.
FIG. 4 is a schematic illustration of the inventive arrangement.
Figure 6:
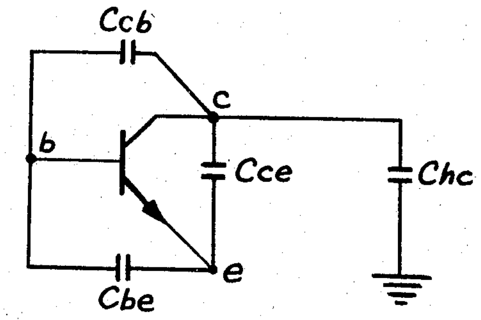
Figure 7:
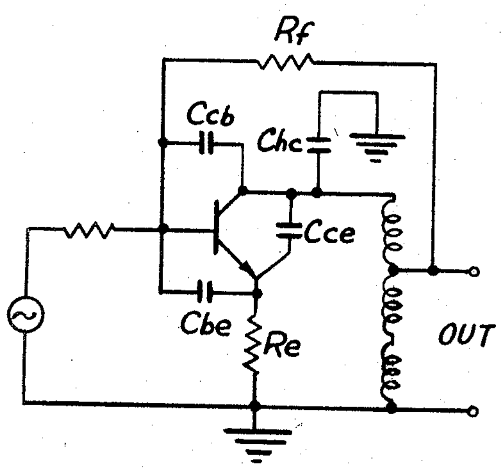

FIGS. *5a* through *5c* illustrate baluns for use in the circuit of FIG. 4 along with the equivalent circuit thereof;

FIG. 6 shows the header-to-lead and header-to-chassis capacitances in the circuit of FIG. 1;

FIG. 7 is the A.C. equivalent of the circuit shown in FIG. 2; and

Figure 8:
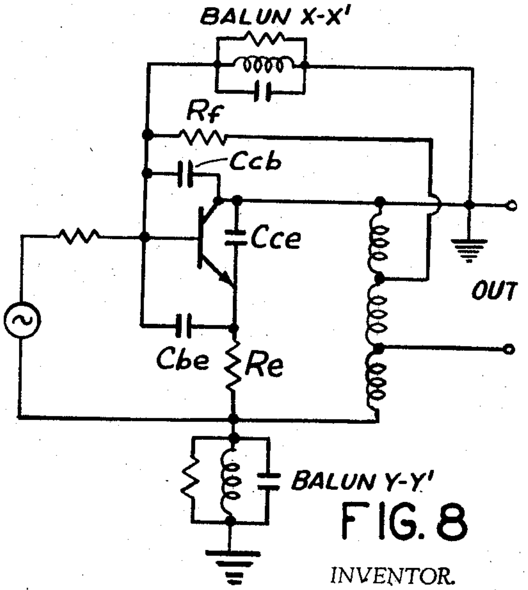

FIG. 8 is the A.C. equivalent of the circuit shown in FIG. 3.

Turning now to the invention, and in particular, to FIG. 2, this figure may be seen to represent the circuit of FIG. 1 modified to include an idealized floating source or input. As may be seen, transistor $Q_1$ is arranged in a common emitter configuration with a transformer $T_1$ in the collector emitter circuit. Transformer $T_1$ would, for example, comprise a trifilar winding on a ferrite core and for the purposes of illustrations, may be assumed to include three serial windings of six turns each. Resistors $R_e$ and $R_f$ provide, respectively, current and voltage feedback to effect the desired low distortion. Base bias is provided by voltage V— through resistors $R_{d_1}$ and $R_{d_2}$.

With the depicted ideal floating source, neither side of which is necessarily grounded, the output may be taken across 12 turns of the output transformer with the low end of the transformer grounded as shown in FIG. 2, or by simply grounding the collector and adding a choke to the low end of the emitter supply and taking the output across 12 turns in the manner shown in FIG. 3.

Thus, a grounded collector circuit with the same performance parimeters as the original circuit is achieved. The assumption implicit in saying that the performance is the same is that there are no significant circuit parimeters in FIGS. 2 and 3 which differ from that of FIG. 1 and that the impedances of the base bias choke $L_1$ and the added choke $L_2$ of FIG. 3 are negligible.

Because as a practical matter, a true floating source (where the input is ungrounded with respect to either lead) is not possible, a practical arrangement must be derived, which will effect such a result.

Such a floating source requirement can be met by using a "balun," forms of which are shown in FIGS. *5a* and *5b*. These figures show the form of balun where two insulated wires are wound together as a pair on the ferrite form. In the examples shown, two modes of wave propagation in the structure are possible. The first which is that shown in FIG. *5a* employs the push-push mode where currents flow in the same directions in both wires. The second is the push-pull mode (FIG. *5b*) where the currents flow in opposite directions on the two wires.

The size and insulation of the two wires are chosen to provide a push-pull circuit with a characteristic impedance matching the input impedance of the amplifier (75 ohms for the circuit perimeters to be delineated hereinafter). The ferrite core push-push configuration would be chosen to provide the highest practical impedance between the two wires at one end and ground. Needless to say, arrangements other than baluns will also come to the mind of those skilled in the art in order to provide the desired isolation and effect the floating source.

The complete circuit utilizing a balun is shown in FIG. 4 where the winding X–X′ is one balun wire and the winding Y–Y′ is the other. This circuit behaves essentially the same as that shown in FIG. 1. The major differences are due to the different positions of the header-to-lead capacitances and header-to-chassis capacitance in the two circuits. The further difference arises from the effect of a balun push-push impedance.

FIG. 6 illustrates the various capacitances, with $C_{cb}$ representing the collector to base capacitance, $C_{be}$ representing base to emitter capacitance, and $C_{ce}$ representing collector to emitter capacitance. The header-to-chassis capacitance is denoted by $C_{hc}$. Representative values would be 1 to 3 picafarads for the header-to-chassis capacitance and .6 picafarads for the remaining capacitances.

Figure 5A:
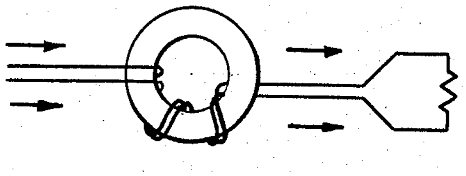
Figure 5B:
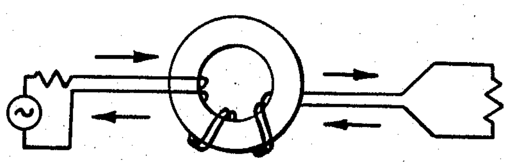
Figure 5C:
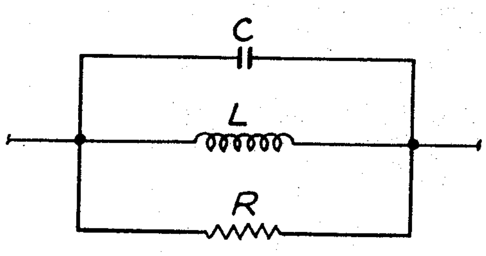

The equivalent impedance of the baluns (either winding X–X' or Y–Y') is typically that shown in FIG. 5c, with the approximate representative values of $C$=.2 picafarads, L–10 microhenries and $R$=5000 ohms.

The net effect of grounding the capacitor and adding the balun is shown by a comparison of FIGS. 7 and 8. Such a comparison indicates that the header-to-chassis capacitance is completely eliminated from the active circuit by shorting it out when the collector is grounded, and two balun impedances are added. One of these windings Y–Y' is effectively in parallel with the collector load and presuming a load of the order of 100 to 300 ohms has very little effect. The other balun wire adds feedback from the collector to the base, and its effect may be easily compensated by changing the value of the feedback resistor $R_f$.

Thus, it may be seen that we have achieved a circuit whose configuration is essentially a common emitter type, thereby giving all the advantages of this type circuit which nonetheless has the thermal capability of a grounded collector.

Typical values for the various components shown are as follows:

| | | |
|---|---|---|
| $R_f$ | ohms | 200 |
| $R_e$ | do | 30 |
| $R_{d1}$ | do | 750 |
| $R_{d2}$ | do | 70 |
| $R_{d3}$ | do | 4000 |

| | | |
|---|---|---|
| V– | volts | 20 |
| $C_1$, $C_2$ and $C_3$ | microfarads | .02 |
| $L_1$ | microhenries | 15 |
| Input impedance | ohms | 75 |
| Output impedance | do | 75 |

While the principles of the invention have been described in connection with specific apparatus, it is to be clearly understood that this description is made only by way of example and not as a limitation to the scope of the invention as set forth in the objects thereof.

What is claimed is:

1. A radio frequency amplifier comprising a transistor in common emitter configuration with the collector grounded; an output transformer; voltage feedback means coupled between a tap on said transformer and the base on said transistor; a current feedback resistor in series with the emitter of said transistor; an input source; and an isolating balun coupled on one end across said input source and on the other end to the transistor base and said feedback resistor.

References Cited

UNITED STATES PATENTS 3,237,119 2/1966 Gewirtz ............ 330—32 X

FOREIGN PATENTS 250,211 5/1963 Australia.
1,173,135 7/1964 Germany.
849,316 9/1960 Great Britain.

ROY LAKE, *Primary Examiner.*

JAMES B. MULLENS, *Assistant Examiner.*

U.S. Cl. X.R.

330—102, 103, 188